United States Patent [19]

Gravrok

[11] Patent Number: 4,853,561
[45] Date of Patent: Aug. 1, 1989

[54] FAMILY OF NOISE-IMMUNE LOGIC GATES AND MEMORY CELLS

[75] Inventor: Roger J. Gravrok, Minneapolis, Minn.

[73] Assignee: Regents of the University of Minnesota, St. Paul, Minn.

[21] Appl. No.: 60,318

[22] Filed: Jun. 10, 1987

[51] Int. Cl.⁴ .................. H03K 17/16; H03K 19/017; H01L 29/80

[52] U.S. Cl. .................................. 307/443; 307/448; 307/450; 307/475; 307/542; 307/558; 307/574; 307/581; 357/22

[58] Field of Search ............... 307/448, 443, 450, 475, 307/542, 558, 574, 581; 357/22 F

[56] References Cited

U.S. PATENT DOCUMENTS

| | | | |
|---|---|---|---|
| 2,989,713 | 6/1961 | Warner, Jr. | 338/20 |
| 4,110,841 | 8/1978 | Schroeder | 365/205 |
| 4,149,099 | 4/1979 | Nagami | 307/279 |
| 4,321,492 | 3/1987 | Hollingsworth | 307/279 |
| 4,349,894 | 9/1982 | Caudel | 365/154 |
| 4,375,677 | 3/1983 | Schuermeyer | 365/154 |
| 4,400,799 | 8/1983 | Gudger | 365/95 |
| 4,405,870 | 9/1983 | Eden | 307/475 |
| 4,554,644 | 11/1985 | Chen et al. | 365/154 |
| 4,578,601 | 3/1986 | McAlister et al. | 307/475 |
| 4,607,350 | 8/1986 | Scianna | 365/154 |
| 4,686,396 | 8/1987 | Law et al. | 307/443 |

FOREIGN PATENT DOCUMENTS

| | | | |
|---|---|---|---|
| 0021141 | 6/1980 | European Pat. Off. | 307/456 |
| 0100545 | 5/1983 | Japan | 307/448 |
| 0121820 | 6/1985 | Japan | 307/448 |

OTHER PUBLICATIONS

M. M. Mano, *Digital Logic and Computer Design*, Prentice-Hall, p. 67 (1979).
Inst. Phys. Conf., No. 339, pp. 227–236 (1977).
IEEE, JSCS, SC-12, pp. 485–496 (1977).
IEEE, ED-29, pp. 1110–1115 (1982).
IEEE, EDL-7, p. 145 (Mar. 1986).
IEEE, JSCC, SC-19, pp. 10–22 (1984).
S. M. Sze, *Physics of Semiconductor Devices*, 2nd Ed., Wiley Interscience, p. 618 (1981).
R. M. Warner, Jr., "A New Passive Semiconductor Component", *IRE National Convention Record*, vol. 6, p. 43, 1958.
Motorola Inc., "I/C Logic for Control Functions in High-Noise Industrial Environments" MC660 Series, Mar. 1971 (4 pages).
J. Lohstroh, *the Punch-Through Device as a Passive Exponential Load in Fast Static Bipolar RAM Cells*, IEEE, JSSX, SC-14, pp. 840–844 (1979).
J. Lohstroh, *Worst-Case Static Noise Margin Criteria for Logic Circuits and their Mathetical Equivalence*, IEEE, JSSC, SC-18, pp. 803–806 (1983).
R. J. Gravrok and R. M. Warner, Jr., *Logic Family and Memory-Cell Designs Providing Abrupt Voltage Transitions and High Noise Margins*.
*Electronics*, Sep. 3, 1987, p. 45, beginning in the middle of the second column entitled "Noise Margins".

*Primary Examiner*—John Zazworsky
*Assistant Examiner*—Margaret Rose Wanbach
*Attorney, Agent, or Firm*—Kinney & Lange

[57] ABSTRACT

A new family of memory cells and digital-logic gates use an enhancement-mode driver, a voltage-level shifter, and a current regulator to provide improved noise margins and large logic swings. The voltage-level shifter and the current regulator are connected in series between an input and the control electrode of the driver. The voltage-level shifter establishes a voltage drop which is independent of current, while the current regulator establishes a constant current in the series path to the control electrode which is independent of voltage. The driver is an enhancement-mode device, such as a JFET, MESFET, or BJT.

49 Claims, 9 Drawing Sheets

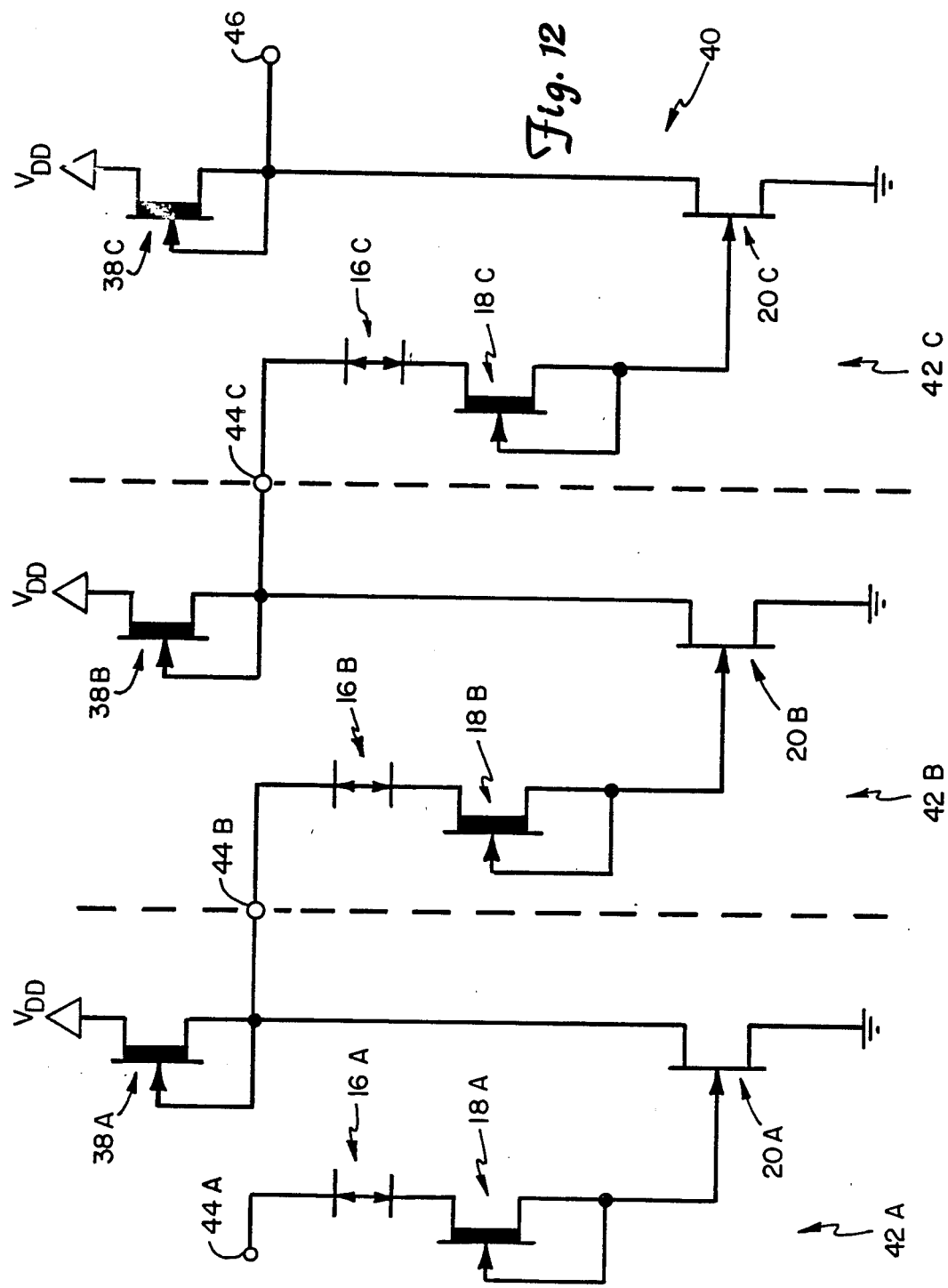

FAMILY OF NOISE-IMMUNE LOGIC GATES AND MEMORY CELLS

REFERENCE TO COPENDING PATENT APPLICATION

Reference is hereby made to a copending patent application entitled "THREE-DIMENSIONAL INTEGRATED CIRCUITS" by R. M. Warner, Jr., et al, which was filed Nov. 19, 1985, Ser. No. 799,652.

BACKGROUND OF THE INVENTION

1. Field of the Invention

The present invention related to digital logic circuits, including memory cells and logic gates.

2. Description of the Prior Art

The monolithic integrated circuit, invented in the late 1950s, pointed the way to unprecedented reliability by diminishing the number of interfaces between dissimilar materials required to implement a given system, since such interfaces invite unwanted and poorly understood physical and chemical phenomena. An ultimate step in the same direction is an all-semiconductor three-dimensional (3-D) integrated circuit such as described in the above-mentioned patent application by R. M. Warner, Jr. et al. 3-D circuits offer increased functional density, reduced interface count and high data throughput as key advantages over present two-dimensional (2-D) integrated circuit fabrication methodologies.

The JFET suggests itself for an all-semiconductor 3-D integrated circuit because it is inherently an all-semiconductor device. Unfortunately, a JFET is typically a "normally on" device, and logic designers prefer "normally off" devices. This can be achieved in a JFET, but at the cost of drastically reduced input-voltage range—about 0.5 volts for a silicon enhancement mode JFET. Another useful all-semiconductor device is the bipolar junction transistor (BJT). It is a "normally off" device which also suffers from a small input-voltage range of about 0.7 volts. However, it has a higher transconductance and can typically handle much larger currents than an FET of similar size. Circuit examples—suitable for 2-D and 3-D—using both devices are presented as part of this invention.

In general there are ten characteristics that describe the ideal digital logic element. (1) Operation from a single power supply source ($V_{DD}$). (2) Large symmetric logic swing—ideally from 0 to $V_{DD}$ volts. (3) Large noise margins at the input—ideally equal to fifty percent of the logic swing. (4) Abrupt transition in the output signal near $V_{DD}/2$ when the input passes $V_{DD}/2$. (5) Minimal propagation delay. (6) High input impedance. (7) Low output impedance. (8) Minimal power consumption during steady state—ideally waste no power once steady state has been achieved. (9) Simplicity in design. (10) A reasonably uncomplicated and cost-effective fabrication process. The prior-art logic families all have fallen short, in some respects, of this ideal performance.

For example, the popular bipolar TTL and ECL logic families have noise margins of 0.4 and 0.2 volts, respectively. Prior-art memory-cell designs suffer from low logic swings and correspondingly small noise margins. The Eccles-Jordon JFET latch and the RTL cell are examples of these prior art memory-cell designs.

In an attempt to improve logic swings, one or more diode junctions have been introduced in the cross-coupling path of prior-art memory cell designs. Examples using this diode concept include buffered FET logic (BFL), E-D MESFET logic, diode coupled FET logic (DCFL) and Schottky-diode FET logic (SDFL). All of these designs are cumbersome and introduce only a limited improvement since they do not include a current regulator as does the present invention.

Prior-art designs using MOS technology do feature large logic swings but do not have as large noise margins as does the present invention. MOS circuits also suffer from limited drive capabilities. In addition, the inclusion of MOS gate oxides is undesirable for implementation in a 3-D integrated circuit.

SUMMARY OF THE INVENTION

The logic circuit of the present invention provides improved noise-margin characteristics and very desirable voltage-transfer characteristics. The circuit includes a voltage level-shifter means and a current-regulator means connected between an input terminal and a control electrode of a driver. The voltage-level shifter establishes a voltage drop across itself which is independent of current through it, while the current regulator establishes a constant current independent of voltage across it.

In preferred embodiments of the present invention, the driver is an enhancement-mode transistor device such as—but not limited to—a bipolar transistor, JFET or a MESFET. The voltage-level-shifter means is preferably a punch-through level shifter, one or more forward diodes or a Zener diode. The current-regulator means is preferably a depletion-mode JFET acting as a voltage "sponge" or some active circuitry such as a current mirror.

In short, the present invention is the useful new combination of a voltage-level shifter and a current regulator connected in series between the input node and the control electrode of an enhancement-mode transistor which is the basis of an entirely new digital logic family.

BRIEF DESCRIPTION OF THE DRAWINGS

FIG. 12 is a schematic diagram of a cascade of three inverters using the present invention.

DETAILED DESCRIPTION OF THE PREFERRED EMBODIMENTS

Figure 1:
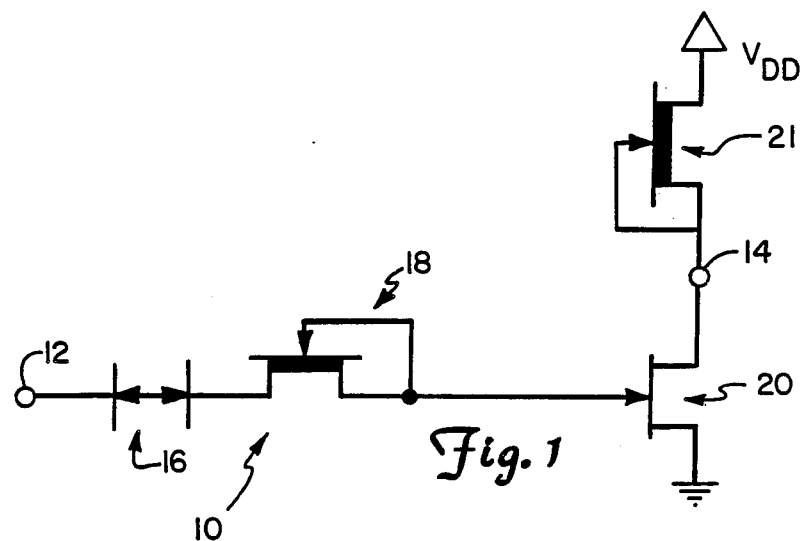
FIG. 1 is an electrical schematic diagram of a preferred embodiment of the semiconductor logic device of the present invention.

The basis of this invention is the configuration of the three separate circuit elements —the voltage-level shifter, the "voltage-sponge" current limiter, and the enhancement-mode driver transistor—to form effectively a new three-terminal device: the Noise Immune Logic Transistor. Configured with a passive load as shown in FIG. 1, this simple inverter circuit is an example of Noise-Immune Logic (NIL)—the suggested name for the logic family of the present invention. The concepts behind these simple examples can be readily extended to more complex circuits and are also claimed as part of this invention.

FIG. 1, shows, in its simplest form, one embodiment of the NIL inverter circuit of the present invention. In this embodiment, logic circuit 10 includes input terminal 12, output terminal 14, punchthrough level shifter 16, depletion-mode (D-mode) JFET 18, enhancement mode (E-mode) JFET 20, and D-mode load JFET 21. In another embodiment, load JFET 21 is replaced by a passive resistor load.

Level shifter 16 and D-mode JFET 18 are connected in series between input terminal 12 and the gate of E-mode JFET 20. Level shifter 16 establishes a voltage drop between its two terminals that is independent of the current flowing through it.

D-mode JFET 18 has its gate and source connected together so that the gate-source voltage $V_{GS}$ is maintained at zero. As a result, D-mode JFET 18 acts as a voltage sponge or current regulator which provides a constant current in the series path between input terminal 12 and the gate of E-mode JFET 20 despite variations in voltage between the source and drain of JFET 18.

E-mode JFET 20 acts as the driver of the logic circuit 10. The signal level at output terminal 14 will depend upon the signal applied to the gate of E-mode JFET 20 which, in turn, is determined by the signal level at input terminal 12 as modified by level shifter 16 and D-mode JFET 18.

To clarify the operation of logic circuit 10, the operation of each of the individual components must first be discussed.

Figure 2:
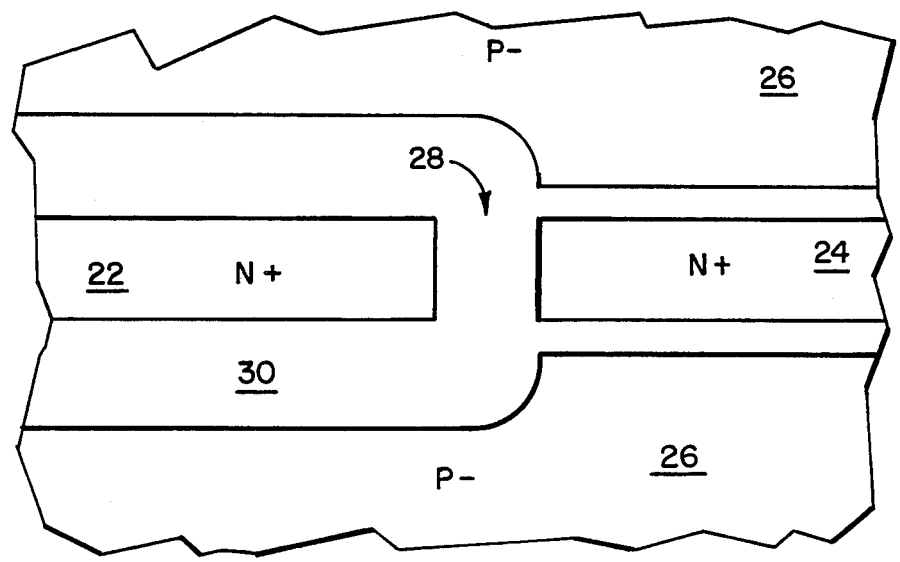
FIG. 2 is a sectional view of an all-semiconductor punch-through level shifter.
Figure 3:
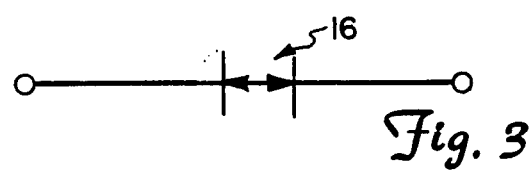
FIG. 3 is a schematic symbol for the level shifter of FIG. 2.
Figure 4:
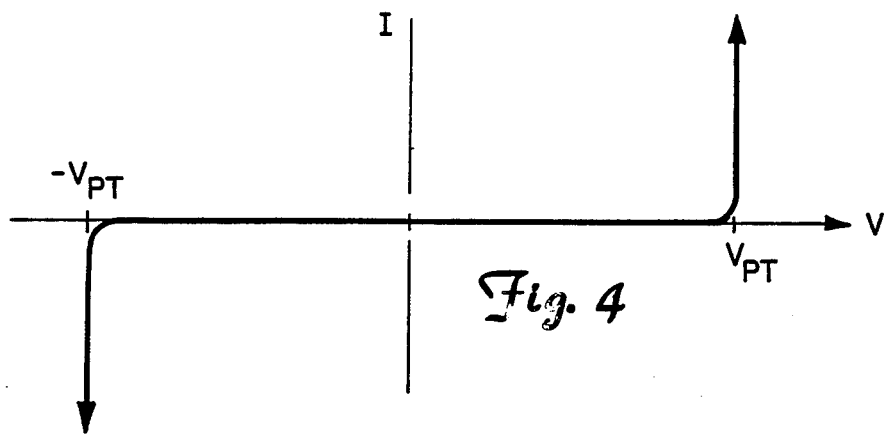
FIG. 4 is a graph showing the current-voltage characteristic of the punch-through level shifter of FIGS. 2 and 3.

FIG. 2 is a sectional view of an all-semiconductor punch-through level shifter 16. Two N+ semiconductor bars 22 and 24 are embedded in a lightly doped uniform P− "matrix" 26 and are separated by gap 28. The electrical operation of punch-through level shifter 16 is much like that of a MOSFET when exhibiting the source-drain punch-through phenomenon. When one of the N regions for example N+ region 22, is positively biased with respect to P− matrix 26 and the other N+ region 24, then the depletion region 30 surrounding N+ region 22 will begin to expand. Only a tiny leakage current flows between N+ regions 22 and 24 until sufficient bias has been applied (to region 22 in this case) to cause depletion region 30 to extend through gap 28 between regions 22 and 24. At the point where the electric field within depletion region 30 extends from region 22 to region 24 (as shown in FIG. 2) the current flowing between regions 22 and 24 will rise very quickly. This effectively holds the external bias between regions 22 and 24 fixed at the punch-through voltage, as shown in the I–V characteristics in FIG. 4. The value of the punch-through voltage $V_{PT}$ can be readily controlled by varying the doping levels of the P− matrix 26 and/or the N+ regions 22 and 24, as well as the size of gap 28 between regions 22 and 24. This punch-through level shifter structure may also be realized by two P+ doped regions embedded in an N− matrix. This punch-through mechanism has been described by S. M. Sze, *Physics of Semiconductor Devices*, 2nd Ed. Wiley Interscience, page 618 (1981).

In the particular embodiment shown in FIG. 2, punch-through level shifter 16 is made entirely of semiconductor material and requires no metallic or insulating regions. By virtue of its reverse biased N+ P− junctions this structure, by itself, is self-isolated. It is, therefore, particularly well suited for a 3-D integrated circuit since it can be fabricated simply by placing gap 28 in an N+ conduction path to form separate N+ regions 22 and 24.

Figure 5:
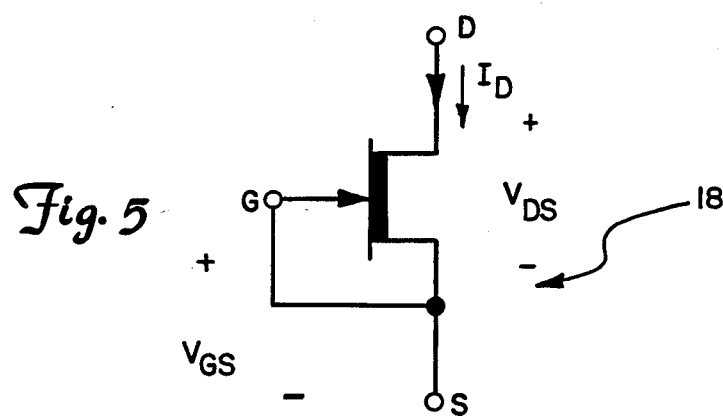
FIG. 5 is a schematic diagram of a depletion-mode JFET connected to operate in its saturation regime.

The second element is a two-terminal depletion-mode JFET 18, which is shown schematically in FIG. 5. When D-mode JFET 18 has its gate G electrically connected to its source, thus holding the gate-source bias $V_{GS}$ fixed at zero volts, JFET 18 operates in its saturation regime as a two-terminal constant current device, provided that the drain-to-source voltage $V_{DS}$ exceeds the small pinch-off voltage $V_P$.

Figure 6:
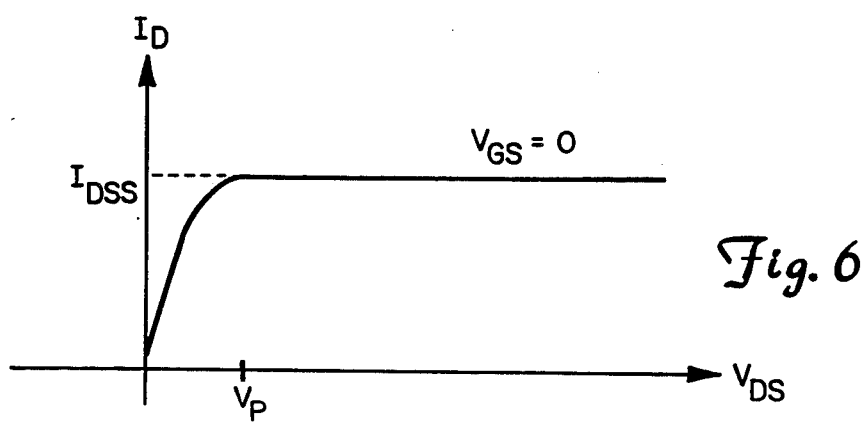
FIG. 6 shows the current voltage characteristic of the depletion-mode JFET of FIG. 5.

The I–V characteristic for D-mode JFET 18 is shown in FIG. 6. The values of pinch-off voltage $V_P$ and drain saturation current $I_{DSS}$ can be controlled by design of the channel properties of JFET 18. When $V_P$ is designed to be near zero volts, JFET 18 can be seen to operate as a "voltage sponge" that passes a constant current $I_{DSS}$ while absorbing whatever voltage is imposed on it by the external circuit. In this configuration, a D-mode JFET is also useful as an active load (as will be discussed later) since it will deliver current at a constant rate independent of the voltage drop across it.

The third circuit element in logic circuit 10 is an enhancement-mode transistor 20. In the preferred embodiment shown in FIG. 1, enhancement-mode transistor 20 is an N-channel enhancement-mode JFET which is used as a driver transistor. Under no gate-source bias ($V_{GS}=0$), the equilibrium P+N− gate-to-channel junction depletion region has completely depleted the thin, lightly doped, N-type channel of carriers. Therefore, current through the channel from drain to source is not possible until a sufficient forward gate-source bias is applied to the P+gate to cause the depletion region in the channel to recede. The gate-source bias at which drain current begins to flow is the threshold voltage $V_T$, and is typically about 0.2 volts. Channel conduction is enhanced when the P+N− gate-channel junction is forward biased beyond $V_T$, but the amount of forward bias tolerable on a silicon PN junction is limited to about 0.7 volts. It is this terribly low logic swing on the gate (approximately 0.5 volts) that has complicated the use of enhancement-mode JFETs in prior art logic circuits. It is the all-semiconductor nature of the JFET, however, that makes it an attractive device for 3-D integrated circuit implementation, and the present invention is a logic circuit which permits the use of enhancement-mode JFETs while providing high noise margins and large voltage swings.

Figure 7:
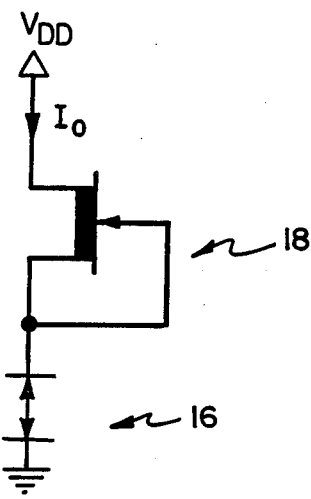
FIG. 7 is a schematic diagram showing a series arrangement of a depletion mode JFET and a punch-through level shifter.
Figure 8:
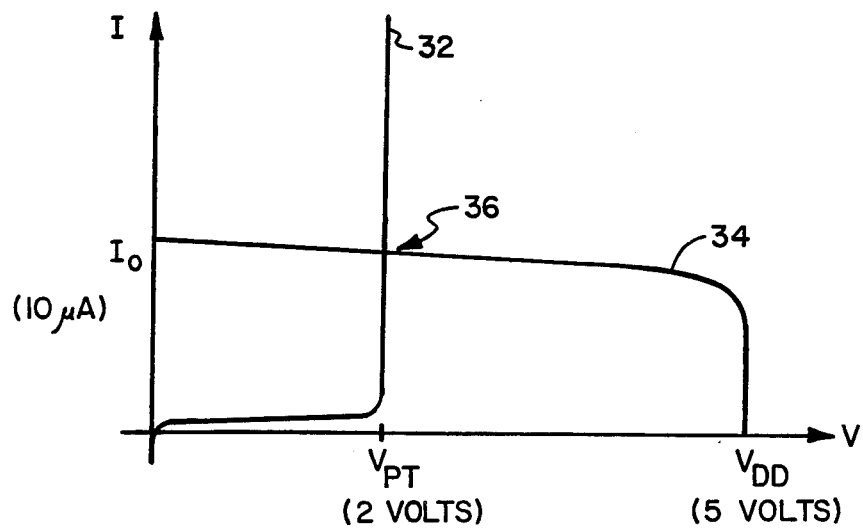
FIG. 8 is a load-line graph showing current as a function of voltage for the circuit of FIG. 7.

FIG. 7 schematically depicts the series arrangement of D-mode JFET 18 and punch-through level shifter 16. The quiescent operating point of this circuit may be found by examining its load-line graph shown in FIG. 8. Curve 32 represents the first-quadrant I-V characteristics of level shifter 16 which has, for the purposes of this example, a punch-through voltage $V_{PT}$ of 2 V. Curve 34 is the reflected and translated first-quadrant I-V characteristics of the D-mode JFET voltage sponge 18 of FIG. 7. Saturation current denoted $I_o$ may typically be about 10 μA. The quiescent operating point of the circuit of FIG. 7 is found at point 36, where curves 32 and 34 intersect. The current that flows through the circuit is fixed by the saturation current $I_o$ of D-mode JFET 18. This current regulation occurs as long as the voltage drop across JFET 18 is greater than its pinch-off voltage $V_p$ and below the gate breakdown voltage $BV_{GS}$. The voltage division across JFET 18 and level shifter 16 is controlled by level shifter 16 independently of the current through the circuit. The voltage drop across level shifter 16 will be $V_{PT}$ and the remaining voltage drop ($V_{DD}-V_{PT}$) will be absorbed across JFET 18, which is acting as a voltage sponge. It is this unique combination of voltage-independent current control by JFET 18 and the current-independent voltage control by level shifter 16 that gives the invention its unique and useful properties.

Figure 9:
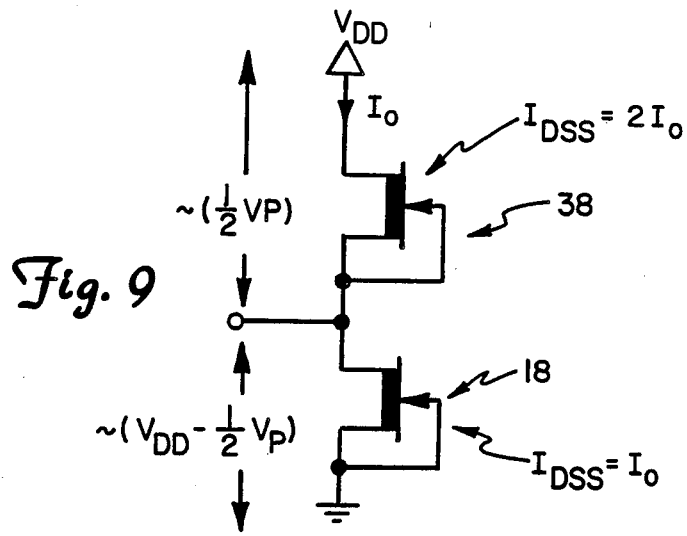
FIG. 9 is a schematic diagram showing a series arrangement of two depletion-mode JFETs.
Figure 10:
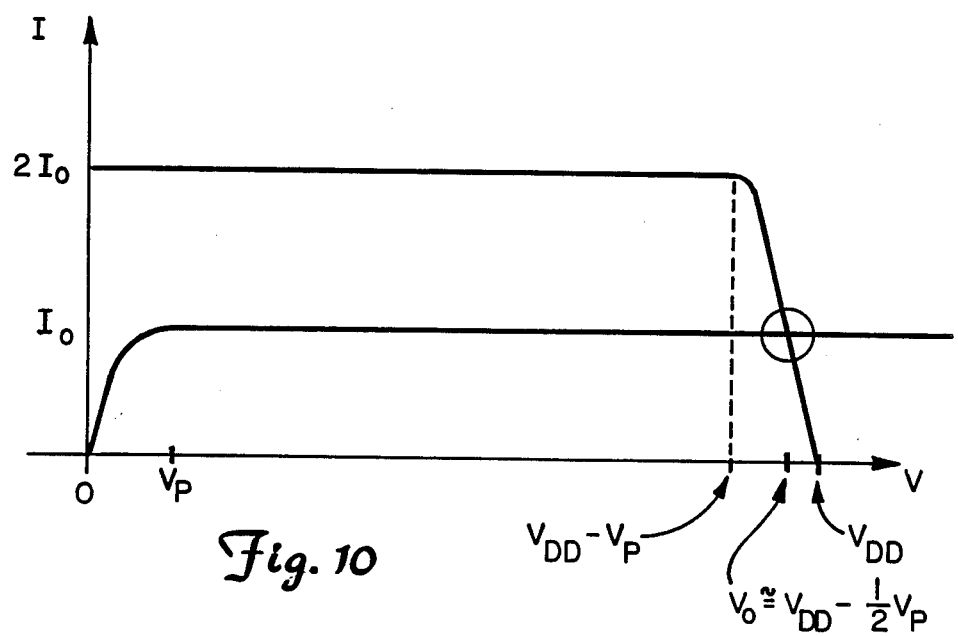
FIG. 10 is a load-line diagram for the circuit of FIG. 9.

The next subcircuit to be understood is schematically depicted in FIG. 9. The circuit consists of a series arrangement of two D-mode JFETS 18 and 38, each with its gate tied to its own source. The saturation current of JFET 18 is taken to be $I_o$. The saturation current of JFET 38 is designed to be larger, by a factor of two, for example. As can been seen from the load line diagram of FIG. 10, JFET 18 limits the series current to $I_o$ amps. The intentional mismatch of saturation currents between JFETS 18 and 38 causes most of the voltage drop to appear across the "weaker" (lower-current) JFET 18, while only approximately one-half $V_P$ will appear across the "stronger" load JFET 38.

Figure 11:
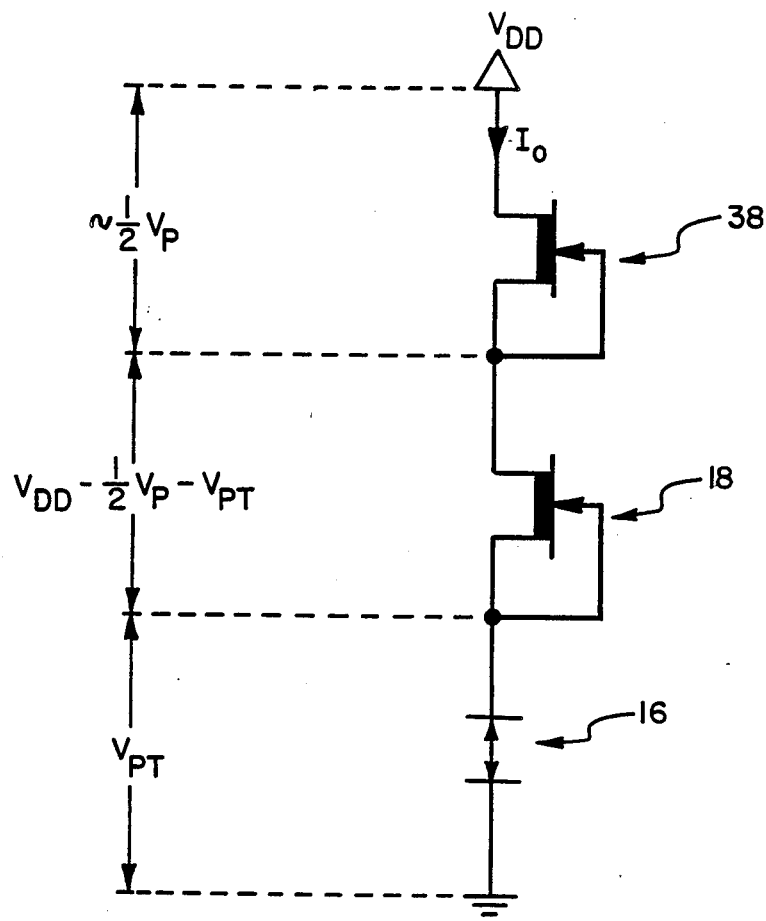
FIG. 11 is a schematic diagram showing a series arrangement of two JFETs and a level shifter.

The final subcircuit to consider consists of a series arrangement of the two JFETs 18 and 38 of FIG. 9 and level shifter 16 of FIG. 7. This circuit is schematically depicted in FIG. 11. From the discussion of FIG. 9 it is clear that the weaker JFET 18 limits the series current to $I_o$. From the discussion of FIG. 7 it is clear that level shifter 16 of FIG. 11 will fix the voltage drop across itself to its punch-through voltage $V_{PT}$, independent of the current through it. In this example where $V_{PT}$ was chosen to be 2 V, this leaves 3 V to be shared by JFETS 18 and 38. Approximately 0.1 V will develop across load JFET 38 if $V_p$ is designed to be about 0.2 V. The remaining voltage (about 2.4 V) will be absorbed across JFET 18 which is acting as a voltage sponge. This voltage division is marked on FIG. 11.

FIG. 12 schematically depicts a cascaded inverter circuit 40 which is a cascade of three inverters 42A14 42C. Each inverter 42A-42C includes an input node 44A-44C, level shifter 16A-16C, D-mode JFET voltage sponge 18A-18C, E-mode JFET driver 20A-20C, and D-mode JFET active load 38A-38C, respectively.

Input node 41A of first inverter 42A is the input node of circuit 40. Input node 44B of second inverter 42B is also the output node of first stage 42A. Similarly, input node 44C of third stage 42C is also the output node of second stage 42B. Output node 46 of third inverter 42C is the output node of circuit 40. The operation and voltage transfer characteristics (VTC) of circuit 40 will be obtained by examining the operation of second inverter 42B.

The series arrangement of active load JFET 38A (of first inverter 42A) with level shifter 16B and voltage sponge 18B of second stage 42B form a circuit similar to that of FIG. 11, except the level shifter (16) and voltage (18) sponge have been interchanged. Nevertheless they will operate in an analogous manner; interchanging the level shifter and voltage sponge has no effect on their series operation. The level shifter 16A-16C may offer a smaller parasitic-capacitance load to the input node 44A-44C. The saturation current of voltage sponge 18B is designed to be $I_o$ while load 38A has a larger saturation current of about $2I_o$. To derive the VTC of inverter 42B and hence the noise margins, start at point 50 of FIG. 13 where the input node 44B experiences zero volts. Driver JFET 20B is off and output node 44C (which is also the input node of third inverter 42C) is pulled high by load 38B to a maximum high of about 4.9 volts, as described in the discussion of FIG. 11. This defines the output high voltage $V_{OH}$. As the voltage on node 44B is increased, driver JFET 20B begins to turn on when $V_{in}=V_{PT}+V_T^{DR}$, where is the threshold voltage of driver JFET 20B. This is the breakpoint 52 where the maximum allowable logic low is defined $V_{IL}$.

A crucial feature of the invention is the voltage-buffering action of level shifter 16B that allows the input voltage to rise significantly before driver JFET 20B is turned on. As the input voltage increases further, the amount of current that flows into the gate of driver JFET 20B is limited to $I_o$ by voltage sponge JFET 18B. This current regulation begins once the voltage drop across JFET 18B has reached its pinch-off voltage $V_P^{SP}$, which may be designed to be about 0.2 V. By assuming the enhancement-mode driver JFET 20B to develop about 0.6 V drop from gate to source with $I_o$ amps flowing into the gate, the minimum allowable voltage for a logic high $V_{IH}$ can be calculated by summing up the voltage drops between input node 44B and ground. Hence $V_{IH}$ (breakpoint 54 in FIG. 13) is found to be $V_{PT}+V_R^{SP}+V_{GS}^{DR}\cong 2.0\ V+0.2\ V+0.6\ V=2.8\ V$ in this example. It is the current-limiting and the voltage-sponging action of D-mode JFET 18B that permits the input node voltage to increase beyond $V_{IH}$ without overdriving the E-mode driver JFET 20. This "sponging action" is another of the key concepts in this invention. To conclude the description of FIG. 13, the output logic low $V_{OL}$ is determined by the relative transconductances of load JFET 38A and driver JFET 20B. A typical design could result in a VOL of about 0.1 V. The following noise-margin calculations are taken from FIG. 13 and are illustrated graphically in FIG. 14. In these calculations, the superscript "DR" relates to driver JFET 20B, the superscript "SP" relates to voltage sponge JFET 18B, and the superscript "LD" relates to load JFET 38A.

$$V_{OH} \cong V_{DD} - 1/2\, V_P^{LD} \qquad \cong 5.0 - 1/2\,(0.2) = 4.9\ V$$

$$V_{IH} \cong V_{GS}^{DR}(ON) + V_{PT} + V_P^{SP} \cong 0.6 + 2.0 + 0.2 = 2.8\ V$$

$$V_{IL} \cong V_T^{DR} + V_{PT} + V_{DS}^{SP} \cong 0.2 + 2.0 + 0.0 = 2.2\ V$$

$$V_{OL} \cong V_{DS}^{DR}(ON) \qquad \cong 0.1\ V$$

High Noise Margin = $NM_{Hi} = V_{OH} - V_{IH} \cong 4.9 - 2.8 = 2.1$ V

Low Noise Margin = $NM_{LO} = V_{IL} - V_{OL} \cong 2.2 - 0.1 = 2.1$ V

Logic Swing = $V_{OH} - V_{OL} \cong 4.9 - 0.1 = 4.8$ V

Figure 13:
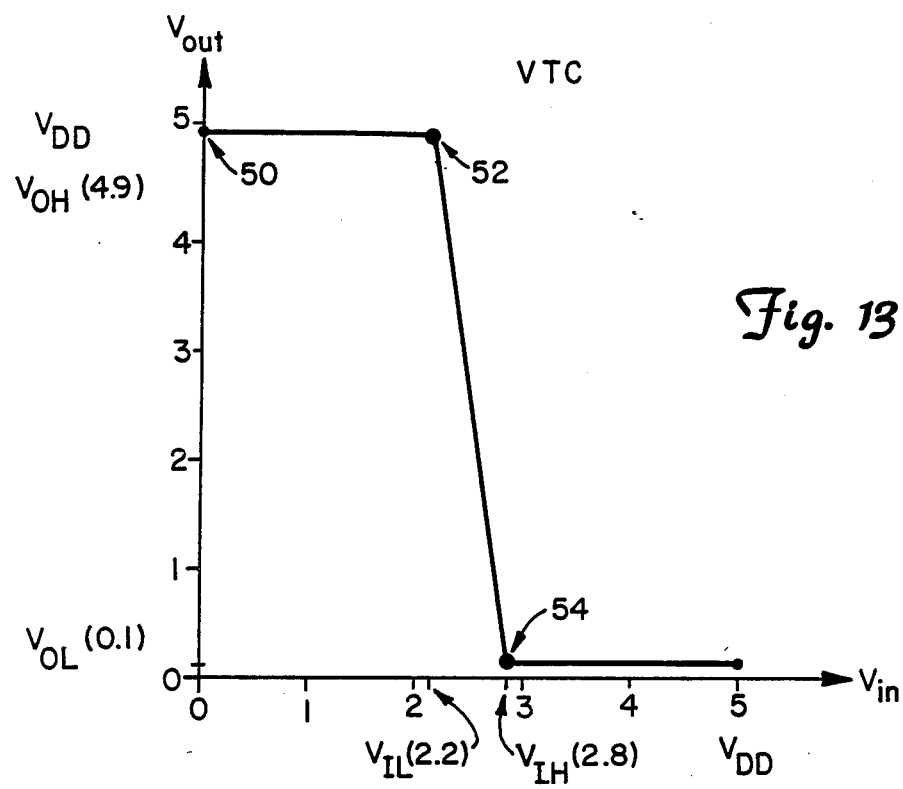
FIG. 13 is a graph showing the voltage transfer characteristics of the middle inverter of the circuit of FIG. 12.
Figure 14:
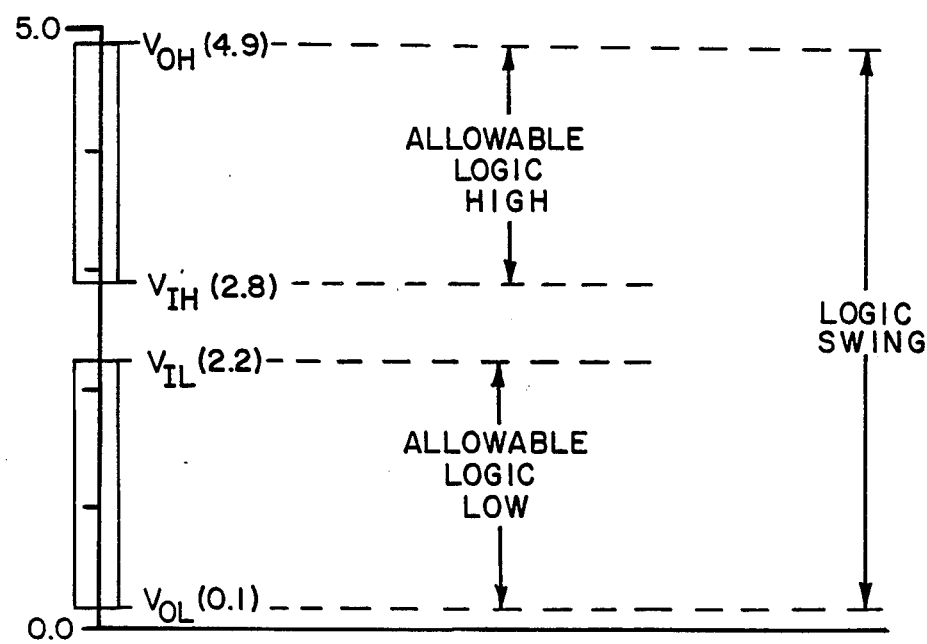
FIG. 14 shows noise-margin characteristics of the middle inverter of the circuit of FIG. 12.

The noise margins attainable with the present invention are the closest to ideal that have been achieved to date—both $NM_{Hi}$ and $MN_{Lo}$ are forty-two percent of $V_{DD}$ and the Logic Swing is ninety-six percent of $V_{DD}$ as demonstrated in the example calculations pertaining to FIGS. 13 and 14. It is the voltage-buffering action of level shifter 16B that gives the wide noise margin for a logic low. It is the voltage-sponging action of D-mode JFET 18B that gives the wide noise margin for the logic high. It is the combined operation of these devices that permits the very large logic swing.

Figure 15:
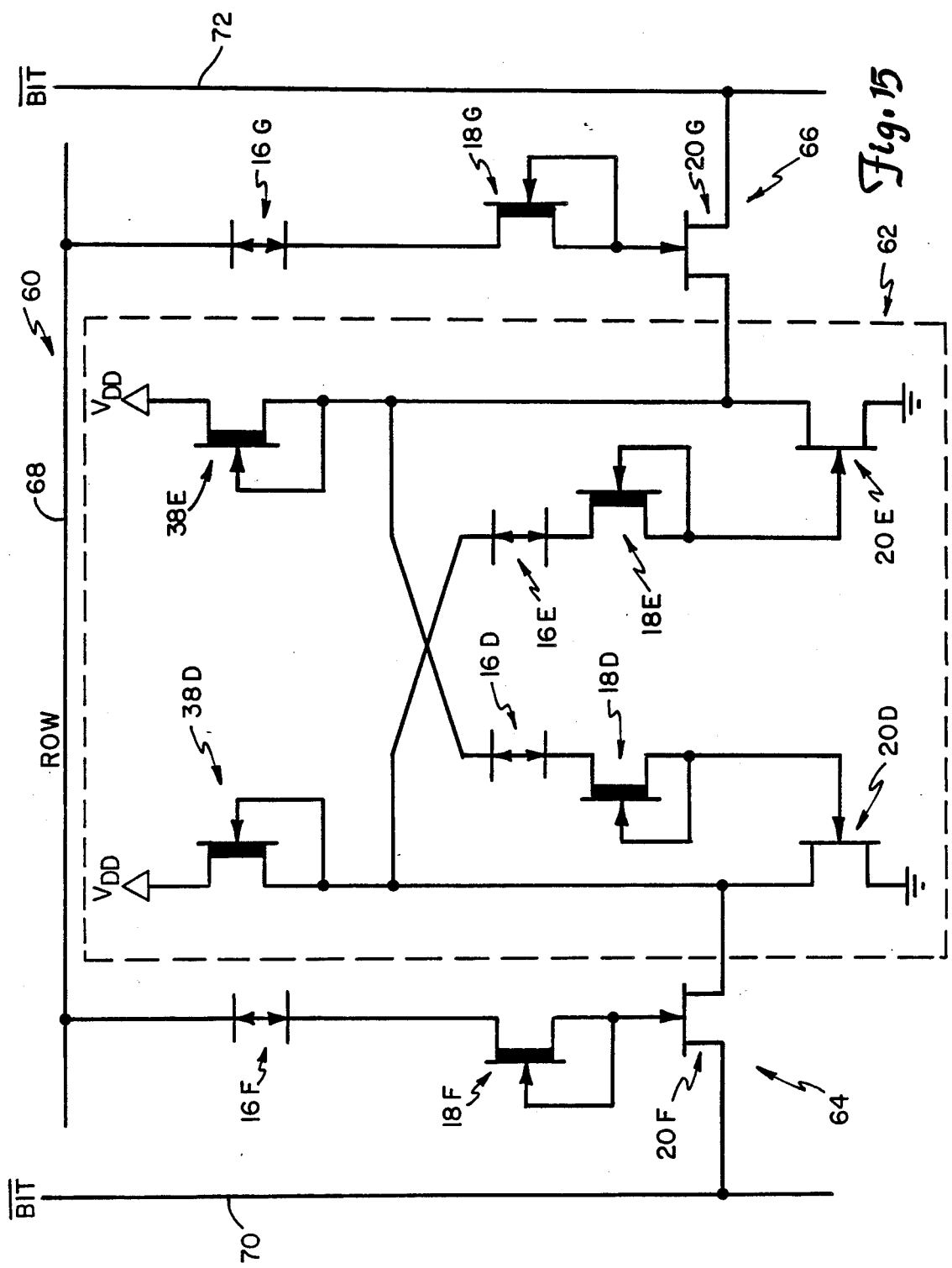
FIG. 15 is a schematic diagram of a static memory cell using the present invention.

A preferred embodiment of a static memory cell 60 suitable for an implementation in a 2D or a 3D integrated circuit is shown in FIG. 15. Cell 62 is configured with a pair of cross-coupled inverters to form the basic cell latch 62 with access circuits 64 and 66 connecting latch 62 to ROW access line 68, BIT and $\overline{BIT}$ data lines 70 and 72.

Cell 60 is electrically addressed by raising ROW access line 68 to a logic high which turns on the E-mode JFET driver access transistors 20F and 20G, which in turn electrically connect the cell latch 62 to the BIT and $\overline{BIT}$ data lines 70 and 72. This single bit memory cell 60 is written to by presenting the appropriate complementary logic signals to BIT and $\overline{BIT}$ data lines 70 and 72 and then raising ROW access line 68 to store the data in cell 60. Reading the data from cell 60 may employ the popular technique of using precharged data lines. The read operation allows the driver transistor 20D or 20E that is turned on to discharge the adjacent data line 70 or 72 through its corresponding access transistor 20F or 20G. The operation of cell 60 is fairly traditional, but it is the incorporation of the level shifters 16D–16G and voltage sponges 18D–18G in series with the gates of the cell drivers and the access transistors 20D–20G, respectively, that gives cell 60 outstanding immunity to noise and high data integrity.

Numerous other digital logic gates based on the present are also possible. Two simple examples are presented in FIGS. 16 and 17. Note that it is this kind of "logic family" which may be required to interface with the memory cell 60 of FIG. 15.

Figure 16:
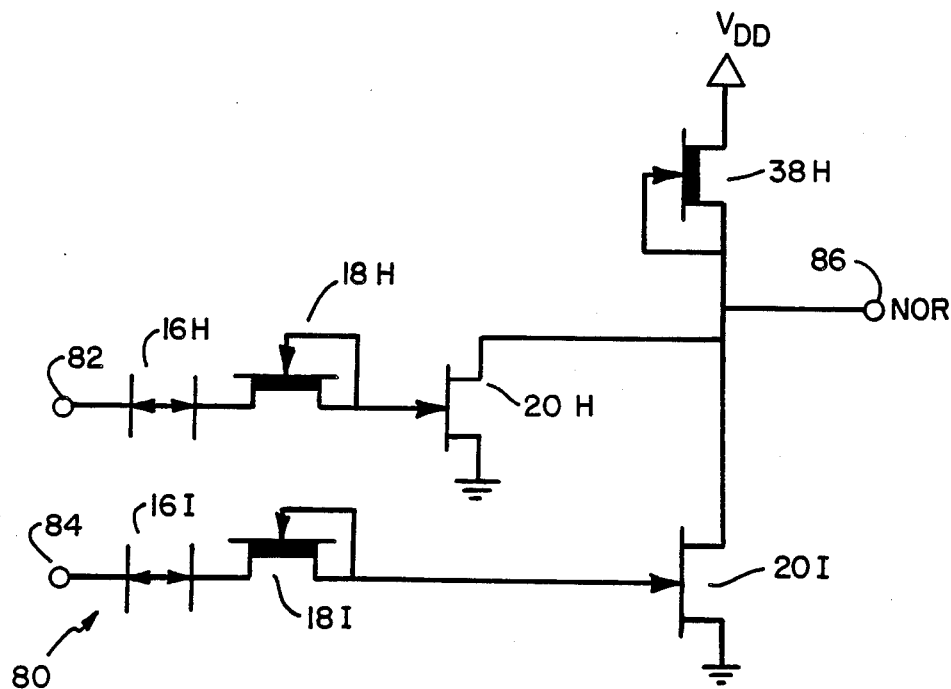
FIG. 16 shows a NOR gate formed using the present invention.

NOR gate 80 shown in FIG. 16 includes a pair of input nodes 82 and 84 and an output node 86. Connected to input node 82 is a series path including level shifter 16H, voltage sponge 18H and driver 20H. Connected to input node B4 is a series path including level shifter 16I, voltage sponge 18I and driver 20I. The drain-source current paths of drivers 20H and 20I are connected in parallel between output node 86 and ground. A common active load D-mode JFET 38H is connected between output node 86 and supply voltage $V_{DD}$.

Figure 17:
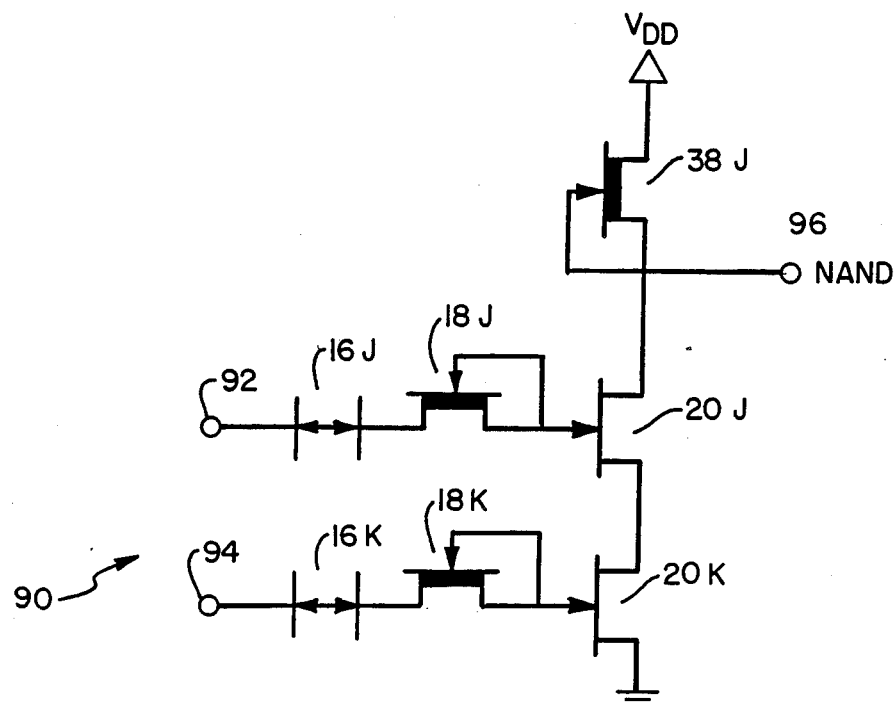
FIG. 17 shows an NAND gate formed using the present invention.

NAND gate 90 shown in FIG. 17 includes a pair of input nodes 92 and 94 and an output node 96. Driver JFETs 20J and 20K are connected in series between output node 96 and ground. Active load D-mode JFET 38J is connected between output node 96 and supply voltage $V_{DD}$. The gate of driver JFET 20J is connected to input node 92 through level shifter 16J and voltage sponge JFET 18J. Similarly, the gate of driver JFET 20K is connected to input node 94 through level shifter 16K and voltage sponge JFET 18K.

The logic circuitry of the present invention offers a number of significant advantages. The range of logic swing and the transition point may be arbitrarily set by designing the value of $V_{PT}$ of the level shifter. The circuit performance is fairly tolerant to changes in component parameters. Due to the independent voltage-current nature of the level shifters and the current sponges, the designer has independent control over voltage swing and current consumption, and hence the overall power dissipation. All of the circuit elements used in the present invention are of fairly simple design and can be implemented in many different technologies. The circuits may be implemented without the use of metals or insulators, which makes the present invention particularly attractive for 3-D integrated circuits, although it also offers significant advantages for 2D integrated circuits. The circuits of the present invention are inherently immune to noise. Memory cells, such as shown in FIG. 15, which use the present invention also are not easily susceptible to data erasure during the read cycle.

Although the embodiments of the present invention which have been discussed thus far use enhancement-mode JFET drivers, the present invention is also applicable to other enhancement-mode type devices used as a driver. An example is a bipolar junction transistor (BJT). In still other embodiments, MESFET or MOSFET, as well as Schottky-clamped bipolar devices may also be used.

Figure 18:
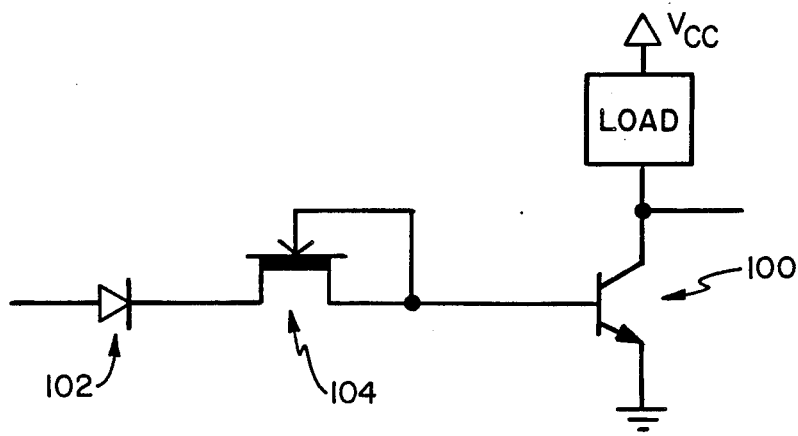
FIG. 18 shows another embodiment of the present invention which uses a bipolar junction transistor (BJT) driver.

FIG. 18 shows another embodiment of the present invention, which uses a BJT driver transistor 100. Connected in series with the base of BJT transistor 100 are a forward diode level shifter 102 and a D-mode JFET voltage sponge or current regulator 104. In other embodiments of the present invention, forward diode 102 is replaced by several forward diodes or an avalanche diode or a Zener diode. The important function of the level shifter is to provide a predetermined voltage drop regardless of current flow. Voltage sponge JFET 104 operates in the same manner which has been described previously—it provides a regulated current of a known magnitude regardless of the voltage which appears between its drain and source. The circuit of FIG. 18 can be easily and very simply formed using conventional integrated circuit fabricated technologies.

Additions and modifications in terms of bleeder resistors and active elements may be added to these basic circuits to enhance their performance without substantially changing the fundamental operating principles of these circuits. All of these enhancements are claimed as part of this invention since the fundamental operating principle remains unchanged. For example a bleeder resistor element could be included to the circuit of FIG. 1 connected between the mode common between level shifter 16 and JFET 18 and the ground node, or a resistor connected between the common node between JFET 18 and JFET 20 and the ground node, useful to bleed off leakage currents.

Other embodiments of these gates and memories employ power supply values ($V_{DD}$) other than 5 volts.

Larger supplies are useful for noisier environments or where different signal levels are used such as automobiles, and smaller supply values are used for higher speed operation where smaller logic swings can be toggled faster and with less power dissipation.

In conclusion, the present invention is an improved semiconductor logic family which offers high noise immunity with improved noise margins and large logic swings. Although the present invention has been described with reference to preferred embodiments, workers skilled in the art will recognize that changes may be made in form and detail without departing from the spirit and scope of the invention.

What is claimed is:

1. A circuit for providing an output signal as a function of an input signal, the output signal switching between first and second logic states when the input signal reaches a logic-transition voltage range; the circuit comprising:
   an input node at which the input signal is received;
   driver means having first and second main current-carrying electrodes and a control electrode for controlling current between the first and second main current-carrying electrodes as a function of a signal received at the control electrode;
   an output node, connected to the driver means, at which the output signal is supplied;
   level-shifter means connected in a current path between the input node and the control electrode for permitting a voltage drop in the current path between the input node and the control electrode approximately independent of current; and
   current-regulator means connected in the current path between the input node and the control electrode for regulating current in the current path between the input node and the control electrode approximately independent of voltage; wherein the level shifter means and the current-regulator means interact to provide first and second noise margins which are larger than the logic-transition voltage range.

2. A circuit comprising:
   an input node;
   driver means having first and second main current-carrying electrodes and a control electrode for controlling current between the first and second current-carrying electrodes as a function of a signal received at the control electrode;
   level-shifter means connected in a current path between the input node and the control electrode for permitting a voltage drop in the current path between the input node and the control electrode approximately independent of current;
   current-regulator means connected in the current path between the input node and the control electrode for regulating current in the current path between the input node and the control electrode approximately independent of voltage; and
   wherein the drive means comprises an enhancement-mode transistor.

3. The circuit of claim 2 wherein the enhancement-mode transistor is a bipolar junction transistor.

4. The circuit of claim 2 wherein the enhancement-mode transistor is and FET.

5. The circuit of claim 4 wherein the FET is a JFET.

6. The circuit of claim 1 wherein the level-shifter means includes a diode.

7. The circuit of claim 1 wherein the level shifter means is connected between the current-regulator means and the control electrode.

8. A circuit comprising:
   an input node;
   driver means having first and second main current-carrying electrodes and a control electrode for controlling current between the first and second current-carrying electrodes as a function of a signal received at the control electrode;
   level-shifter means connected in a current path between the input node and the control electrode for permitting a voltage drop in the current path between the input node and the control electrode approximately independent of current;
   current-regulator means connected in the current path between the input node and the control electrode for regulating current in the current path between the input node and the control electrode approximately independent of voltage; and
   wherein the level shifter means comprises a punch-through level shifter.

9. A circuit comprising:
   an input node;
   driver means having first and second main current-carrying electrodes and a control electrode for controlling current between the first and second current-carrying electrodes as a function of a signal received at the control electrode;
   level-shifter means connected in a current path between the input node and the control electrode for permitting a voltage drop in the current path between the input node and the control electrode approximately independent of current;
   current-regulator means connected in the current path between the input node and the control electrode for regulating current in the current path between the input node and the control electrode approximately independent of voltage; and
   wherein the current-regulator means comprises a depletion-mode transistor.

10. The circuit of claim 9 wherein the depletion-mode transistor is an FET operating in a saturation regime.

11. The circuit of claim 9 wherein the depletion-mode transistor is an FET having a gate and a source connected together.

12. The circuit of claim 11 wherein the FET is a JFET.

13. A circuit comprising:
   an input node;
   driver means having first and second main current-carrying electrodes and a control electrode for controlling current between the first and second current-carrying electrodes as a function of a signal received at the control electrode;
   level-shifter means connected in a current path between the input node and the control electrode for permitting a voltage drop in the current path between the input node and the control electrode approximately independent of current;
   current-regulator means connected in the current path between the input node and the control electrode for regulating current in the current path between the input node and the control electrode approximately independent of voltage; and
   first load means connected to the current path.

14. The circuit of claim 13 wherein the first load means comprises an FET operating in a saturation regime.

15. The circuit of claim 13 wherein the current-regulator means comprise an FET operating in a saturation regime.

16. The circuit of claim 15 wherein the first load means has a saturation current which is greater then a saturation current of the current-regulator means.

17. The circuit of claim 13 and further comprising:
second load means connected in series with the first and second main current carrying electrodes of the driver means.

18. The circuit means of claim 13 wherein the first load means is connected between the input node and a supply voltage node.

19. A circuit comprising:
an input node;
driver means having first and second main current-carrying electrodes and a control electrode for controlling current between the first and second current-carrying electrodes as a function of a signal received at the control electrode;
level-shifter means connected in a current path between the input node and the control electrode for permitting a voltage drop in the current path between the input node and the control electrode approximately independent of current;
current-regulator means connected in the current path between the input node and the control electrode for regulating current in the current path between the input node and the control electrode approximately independent of voltage; and
wherein the level-shifter means and the current-regulator means are connected in series between the input node and the control electrode.

20. A circuit comprising:
an input node;
driver means having first and second main current-carrying electrodes and a control electrode for controlling current between the first and second current-carrying electrodes as a function of a signal received at the control electrode:
level-shifter means connected in a current path between the input node and the control electrode for permitting a voltage drop in the current path between the input node and the control electrode approximately independent of current;
current-regulator means connected in the current path between the input node and the control electrode for regulating current in the current path between the input node and the control electrode approximately independent of voltage; and
wherein the level shifter means comprises a punch-through level shifter, the current-regulator means comprises a depletion-mode FET, and the driver means comprises an enhancement-mode FET.

21. A circuit comprising:
an input node;
driver means having first and second main current-carrying electrodes and a control electrode for controlling current between the first and second current-carrying electrodes as a function of a signal received at the control electrode;
level-shifter means connected in a current path between the input node and the control electrode for permitting a voltage drop in the current path between the input node and the control electrode approximately independent of current; and
current-regulator means connected in the current path between the input node and the control electrode for regulating current in the current path between the input node and the control electrode approximately independent of voltage; and
load means connected to the main current path of the driver means.

22. A circuit which exhibits an output state at an output node which changes when an input voltage at an input node reaches a logic-transition voltage range defined by first and second logic-transition voltage levels, the circuit comprising:
first and second supply voltage nodes;
first driver means having first and second main current-carrying electrodes and a control electrode;
first level shifter means connected in a first current path to the control electrode for reducing voltage applied to the control electrode of the first driver means to permit the input voltage to vary in a first noise margin region between a first voltage extreme and the first logic-transition voltage level without causing the output state at the output node to change from a first state to a second state; the first noise margin region being greater than the logic-transition voltage range;
first current regulator means connected in the first current path for regulating current to the control electrode of the first driver means and for permitting the input voltage to vary in a second noise margin region between a second voltage extreme and second logic-transition voltage level without causing the output state at the output node to change from the second state to the first state; the second noise margin region being greater than the logic-transition voltage range;
first load means connected in series with the first and second main current carrying electrodes of the first driver means between the first and second supply-voltage nodes.

23. A circuit comprising:
first and second supply voltage nodes;
first driver means having first and second main current-carrying electrodes and a control electrode;
first level shifter means connected in a first current path to the control electrode for reducing voltage applied to the control electrode of the first driver means;
first current regulator mean connected in the first current path for regulating current to the control electrode of the first driver means;
first load means connected in series with the first and second main current carrying electrodes of the first driver means between the first and second supply-voltage means;
second driver means having a control electrode and having first and second main current-carrying electrodes;
second level-shifter means connected in a second current path to the control electrode of the second driver means for reducing voltage applied to the control electrode of the second driver means; and
second current-regulator means connected in the second current path for regulating current to the control electrode of the second driver means.

24. The circuit of claim 23 and further comprising:
a first input node;

a second input node;
an output node connected to the first main current-carrying electrode of one of the first and second driver means;
wherein the first level-shifter means and the first current-regulator means are connected in the first current path between the first input node and the control electrode of the first driver means; and
wherein the second level-shifter means and the second current-regulator means are connected in the second current path between the second input node and the control electrode of the second driver means.

25. The circuit of claim 24 wherein the first and second main current-carrying electrodes of the first and second driver means are connected in series.

26. The circuit of claim 24 wherein the first and second main current-carrying electrodes of the first and second driver means are connected in parallel.

27. The circuit of claim 24 wherein the second input node is connected between the first load means and the first main current-carrying electrode of the first driver means.

28. The circuit of claim 27 and further comprising:
second load means connected in series with the first and second main current carrying electrodes of the second driver means.

29. The circuit of claim 28 wherein the output node is connected between the second load means and the first main current carrying electrode of the second driver means.

30. The circuit of claim 28 wherein the first input node is connected between the second load means and the first main current carrying electrode of the second driver means.

31. A circuit comprising:
first and second supply voltage nodes;
first driver means having first and second main current-carrying electrodes and a control electrode;
first level shifter means connected in a first current path to the control electrode for reducing voltage applied to the control electrode of the first driver means;
first current regulator means connected in the first current path for regulating current to the control electrode of the first driver means;
first load means connected in series with the first and second main current carrying electrodes of the first driver means between the first and second supply-voltage nodes;
wherein the first driver means comprises an enhancement-mode transistor.

32. The circuit of claim 31 wherein the enhancement-mode is a bipolar junction transistor.

33. The circuit of claim 31 wherein the enhancement-mode transistor is an FET.

34. The circuit of claim 31 wherein the first current regulator means comprises a depletion-mode transistor operating in a saturation regime.

35. The circuit of claim 34 wherein the depletion-mode transistor is an FET.

36. The circuit of claim 34 wherein the first load means comprises a depletion-mode transistor operating in a saturation regime.

37. The circuit of claim 36 wherein the first load means has a saturation current which is greater than a saturation current of the first current-regulator means.

38. A circuit comprising:
first and second supply voltage nodes;
first driver means having first and second main current-carrying electrodes and a control electrode;
first level shifter means connected in a first current path to the control electrode for reducing voltage applied to the control electrode of the first driver means;
first current regulator means connected in the first current path for regulating current to the control electrode of the first driver means;
first load means connected in series with the first and second main current carrying electrodes of the first driver means between the first and second supply-voltage nodes;
wherein the first level-shifter means and the first current-regulator means are connected in series with the control electrode of the first driver means.

39. A circuit comprising:
first and second supply voltage nodes;
first driver means having first and second main current-carrying electrodes and a control electrode;
first level shifter means connected in a first current path to the control electrode for reducing voltage applied to the control electrode of the first driver means;
first current regulator means connected in the first current path for regulating current to the control electrode of the first driver means;
first load means connected in series with the first and second main current carrying electrodes of the first driver means between the first and second supply-voltage nodes;
wherein the first level-shifter means is connected between the first current-regulator means and the first driver means.

40. A digital circuit comprising:
an input node;
enhancement-mode driver means having first and second main current-carrying electrodes and a control electrode;
load means connected in series with the first and second main current-carrying electrodes; and
means connected in a current path between the input node and the control electrode for regulating current in the current path approximately independent of voltage.

41. The digital circuit of claim 40 and further comprising:
means connected in the current path for permitting a voltage drop in the current path between the input node and the control electrode approximately independent of current.

42. A digital circuit which exhibits first and second output stages which are a function of an input voltage which varies between first and second input voltage extremes, and which changes output site when the input voltage reaches a logic-transition voltage range defined by first and second logic-transition voltage levels, the digital circuit comprising:
an input mode;
driver means having first and second main current-carrying electrodes and a control electrode;
load means connected in series with the first and second main current-carrying electrodes;
level-shifter means connected in a current path between the input node and the control electrode for establishing a voltage drop that defines the first logic-transition voltage level while permitting the input voltage to vary in a first noise margin region between the first voltage extreme and the first logic-transition voltage level without causing a change of output state; and means connected in the current path for regulating current in the current path between the input node and the control electrode while permitting the input voltage to vary in a second noise margin region between the second voltage extreme and the second logic-transition voltage level without causing a change of output state, wherein the first and second noise margins exceed the logic-transition voltage range in magnitude.

43. A digital circuit comprising:

an input node;

driver means having first and second main current-carrying electrodes and a control electrode;

load means connected in circuit with the first and second main current-carrying electrodes; and punch-through level-shifter means connected between the input node and the control electrode;

wherein the driver means includes an enhancement-mode transistor.

44. A digital circuit which exhibits first and second logic states at an output node as a function of an input signal received at an input node, the digital circuit exhibiting the first logic state when the input signal is below a first logic-transition voltage level and exhibits the second logic state when the input signal is above a second logic-transition voltage level; the digital circuit comprising:

driver means connected to the output node for switching between a first and a second conduction state to determine the logic state at the output node;

circuit means connected between the input node and a control electrode of the driver means, the circuit means including:

first means for switching from a nonconductive state to a conductive state when the input signal reaches the first logic-transition voltage level at the input node; the first means permitting the input signal at the input node to be changed in a noise margin region from a first input voltage extreme to the first logic transition voltage level without causing the digital circuit to change logic state; and the first means, when in its conductive state, causing the digital circuit to change logic state; and second means for regulating current through itself that is approximately independent of voltage across itself, the second means thereby permitting the input signal to vary in a noise margin region from the second logic transition voltage level to a second input-voltage extremes while the digital circuit remains in the second logic state;

wherein a first noise margin region defined by the first voltage extreme and the first logic-transition voltage level is greater than a logic-transition voltage range defined by the first and second logic-transition voltage levels; and wherein a second noise margin region defined by the second voltage extreme and the second logic-transition voltage level is greater than the logic-transition voltage range.

45. A digital circuit for providing an output signal which exhibits first and second logic states depending on magnitude of an input signal voltage with respect to a logic-transition voltage range, the digital circuit comprising:

an input node;

an output node;

driver means for switching between first and second conduction states as a function of current at a control electrode, the driver means being connected to the output node; and circuit means connected between the input node and the control electrode so that terminal current at the input node is substantially equal in magnitude to the current at the control electrode, the circuit means comprising:

first means for permitting a first variable voltage drop across itself without conducting substantial current through itself, thereby permitting the input signal voltage at the input node to be changed from a first input voltage extreme to the logic-transition voltage range without changing the first logic state, which yields a first noise margin for the digital circuit pertaining to the first logic state, wherein the logic-transition voltage range at the input node is determined by a specific voltage value from terminal to terminal of the first means and when voltage from terminal to terminal is increased slightly beyond the specific voltage value then substantial current flows through the first means and the digital circuit begins to change from the first logic state to the second logic state; and second means for regulating current through itself, approximately independent of voltage, thereby regulating the current through the control electrode of the driver means, wherein the second means serves as a voltage sponge, thereby permitting the input voltage signal at the input node to vary beyond the logic-transition voltage range to a second input voltage extreme while the digital circuit remains in the second logic state, thereby yielding a second noise margin for the digital circuit pertaining to the second logic state;

wherein the first and second noise margins are greater than the logic-transition voltage range.

46. A digital circuit for providing an output signal which exhibits first and second logic states at an output node depending on magnitude of an input voltage at an input node with respect to a logic-transition voltage range, the digital circuit comprising:

driver means connected to the output node for determining which of the first and second logic states will appear at the output node as a function of a control signal received at the control electrode of the driver means, the first logic state being exhibited when the driver means is on, and the second logic state being exhibited when the driver means is off; and circuit means connected to the input node and to the control electrode of the driver means for supplying the control signal as a function of the input voltage to control turn-on and turn-off of the driver means, the circuit means including:

first means for permitting the input voltage to change in a first noise margin region from a first voltage extreme to the logic-transition voltage range without a change in the logic state at the output node and for switching from a nonconductive to a conductive state when the input voltage reaches the logic-transition voltage that is defined by the first means switching to a conductive state; and --second means for regulating current through the control electrode when the first means is in a conductive state, while permitting voltage at the input node to vary in a second noise margin region from the logic-transition voltage range to a second voltage extreme without causing a change in the second logic state at the output node;

wherein the first and second noise margin regions are greater than the logic-transition voltage range.

47. A digital circuit for providing an output signal which exhibits first and second logic states at an output node depending on magnitude of an input voltage at an input node with respect to a logic transition voltage range, the digital circuit comprising:

driver means connected to the output node for determining which of the first and second logic states will appear at the output node as a function of a control signal received at a control electrode of the driver means, the first logic state being exhibited when the driver means is on and the second logic state being exhibited when the driver means is off; and a circuit between the input node and the control electrode for providing the control signal as a function of the input signal, the circuit including;

first means for switching from a nonconductive to a conductive state when the input signal reaches the logic transition voltage range; and second means connected in series with the first means for regulating current through the control electrode when the first means is in a conductive state, while providing a variable voltage drop to accommodate input signal voltage outside of the logic-transition voltage range; the first and second means interacting to provide noise margins which are greater than the logic-transition voltage range.

48. In a digital circuit which includes: first and second supply-voltage nodes; an input node; an output node; a first driver having a main-current path connected between the first supply-voltage node and the output node, and having a first control electrode; and in which the digital circuit has a first logic state in which the first driver is ON and a second logic state in which the first driver is OFF: an improvement comprising:

circuit means that comprises electrical paths between the input node and the control electrode, and at least one series combination of circuit elements comprising constant-voltage means and a constant-current means that is connected to an electrical path between an input node and the first control electrode, wherein the circuit means, including the series combination, controls current through the control electrode to permit input voltage at the input node to be varied from a first input-voltage extreme to a first boundary of a logic-transition voltage range without causing a transition from the first to the second logic state of the digital circuit, which thereby yields a first noise margin that is larger than the logic-transition voltage range, and to permit the input voltage to be varied from a second boundary of the logic-transition voltage range to a second input-voltage extreme without causing a transition from the second to the first logic state, thereby defining a second noise margin that is larger than the logic-transition voltage range.

49. The improvement of claim 48 wherein:

the constant-voltage permits a first variable-voltage drop across itself without conducting a substantial current until the first variable-voltage drop reaches a specific turn-on voltage, at which point the constant-voltage element begins to conduct; and the constant-current means absorbs a second variable-voltage drop across two of its terminals while independently maintaining a substantially constant current through itself.

* * * * *

UNITED STATES PATENT AND TRADEMARK OFFICE
CERTIFICATE OF CORRECTION

PATENT NO. : 4,853,561

DATED : August 1, 1989

INVENTOR(S) : Roger J. Gravrok

It is certified that error appears in the above-identified patent and that said Letters Patent is hereby corrected as shown below:

Column 9, line 64 delete "and", insert --an--.

Column 11, line 8, delete "then", insert --than--.

Column 14, line 56, delete "site", insert --state--.

Signed and Sealed this

Twenty-ninth Day of May, 1990

Attest:

HARRY F. MANBECK, JR.

Attesting Officer

Commissioner of Patents and Trademarks